(12) United States Patent
Hsu et al.

(10) Patent No.: US 6,441,648 B1
(45) Date of Patent: Aug. 27, 2002

(54) DOUBLE DATA RATE DYNAMIC LOGIC

(75) Inventors: Steven K. Hsu, Lake Oswego; Shih-Lien L. Lu; Ram Krishnamurthy, both of Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/852,442

(22) Filed: May 9, 2001

(51) Int. Cl.[7] ............................................. H03K 19/01
(52) U.S. Cl. ............................ 326/98; 326/95; 326/96; 326/97; 327/208; 327/214; 327/224
(58) Field of Search .............................. 326/93, 95–98; 327/208–212, 214, 215, 224, 225

(56) References Cited

U.S. PATENT DOCUMENTS

| | | | | |
|---|---|---|---|---|
| 5,023,480 A | * | 6/1991 | Gieseke et al. | |
| 5,272,397 A | * | 12/1993 | Chen et al. | 307/452 |
| 5,384,493 A | * | 1/1995 | Furuki | 327/203 |
| 6,090,153 A | * | 7/2000 | Chen et al. | 716/8 |
| 6,265,899 B1 | * | 7/2001 | Abdel-Hafeez et al. | 326/96 |

* cited by examiner

*Primary Examiner*—Michael Tokar
*Assistant Examiner*—Vibol Tan
(74) *Attorney, Agent, or Firm*—Seth Z. Kalson

(57) ABSTRACT

A double data rate dynamic logic gate in which an evaluation phase is performed for each phase of a clock signal. In one embodiment, an nMOSFET pull-down logic unit is clocked by two nMOSFETs switched in complementary fashion, and dynamic latches provide the output signals. In another embodiment, two nMOSFET pull-down logic units are employed, each clocked by an nMOSFET in complementary fashion, and a static logic unit provides the output signals.

16 Claims, 5 Drawing Sheets

DOUBLE DATA RATE DYNAMIC LOGIC

FIELD

Embodiments of the present invention are directed to digital circuits, and more particularly, to dynamic logic gates.

BACKGROUND

Dynamic (or domino) logic gates are ubiquitous building blocks in many high performance digital circuits. In particular, for microprocessors, dynamic logic gates find their way into many functional units, such as multipliers and adders, among others. Dynamic logic gates allow for pipelining to increase throughput, and make use of nMOSFETs (Metal Oxide Semiconductor Field Effect Transistor) to speed logic evaluation.

An example of a four stage dynamic logic circuit (or domino circuit) is provided in FIG. 1. Each nMOSFET logic unit 101, 102, 103, and 104 denotes one or more nMOSFETs connected in various combinations of parallel and serial configurations so as to achieve the overall desired Boolean expression performed by the dynamic logic circuit. For simplicity, only one input port is shown for each nMOSFET logic unit, but there may in fact be several such input ports for each nMOSFET logic unit. Four clock signals, $\phi_i$, $i=1, 2, 3, 4$, are provided in FIG. 1. These clock signals are staggered in phase by $\pi/2$, that is, for each $i=1, 2, 3$, $\phi_{i+1}$ lags $\phi_i$ by $\pi/2$ radians.

Considering stage 1 of the dynamic logic circuit of FIG. 1, the pre-charge phase begins on the falling edge of the clock signal $\phi_1$, i.e., when $\phi_1$ transitions from HIGH to LOW, so that pMOSFET 106 turns ON and nMOSFET 108 turns OFF. With nMOSFET 108 OFF, nMOSFET logic unit 101 is isolated from ground (substrate), and with pMOSFET 106 ON, node 110 is pulled HIGH. Inverter 112 and pMOSFET 114 function as a keeper, so that node 110 is weakly held HIGH unless otherwise pulled LOW by nMOSFET logic unit 101 during the evaluation phase. Inverter 116 is a static inverter, so that the input to stage 2 of the dynamic logic circuit is LOW when stage 1 is in its pre-charge phase. The evaluation phase begins on the rising edge of the clock signal $\phi_1$, i.e., when $\phi_1$ transitions from LOW to HIGH, so that nMOSFET logic unit 101 is now coupled to ground via nMOSFET 108. In the evaluation phase, nMOSFET logic unit 101 may pull node 110 LOW depending upon its input. If not, then keeper pMOSFET 114 keeps node 110 HIGH as mentioned earlier.

By staggering the phases of the clock signals, the various stages illustrated in FIG. 1 may be pipelined together to achieve a high throughput, so that input is provide, to the dynamic logic circuit at the clock rate.

DESCRIPTION OF EMBODIMENTS

Figure 1:
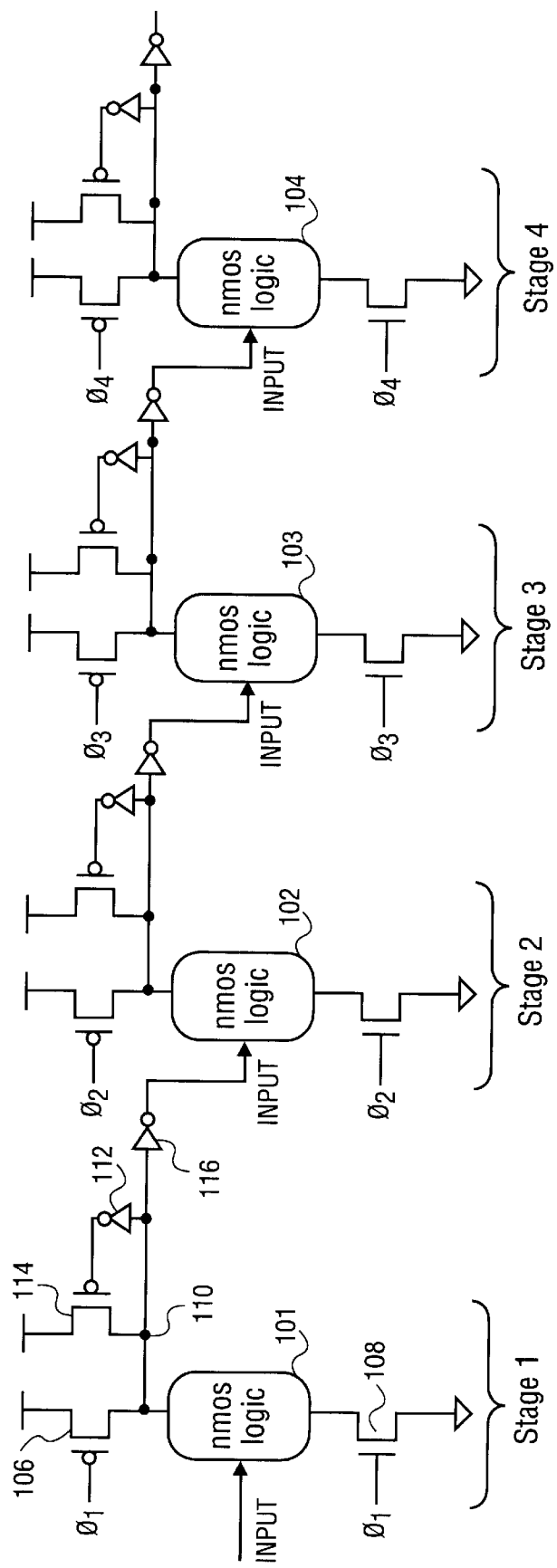
FIG. 1 is a prior art dynamic logic gate pipeline.

Embodiments of the present invention provide for dynamic logic circuits with increased throughput over the dynamic logic circuit of FIG. 1 for the same clock frequency. An evaluation phase may be performed for each phase of a clock signal. As a result, embodiments of the present invention may realize twice the throughput as that of the dynamic logic circuit of FIG. 1 for the same clock frequency.

Figure 2:
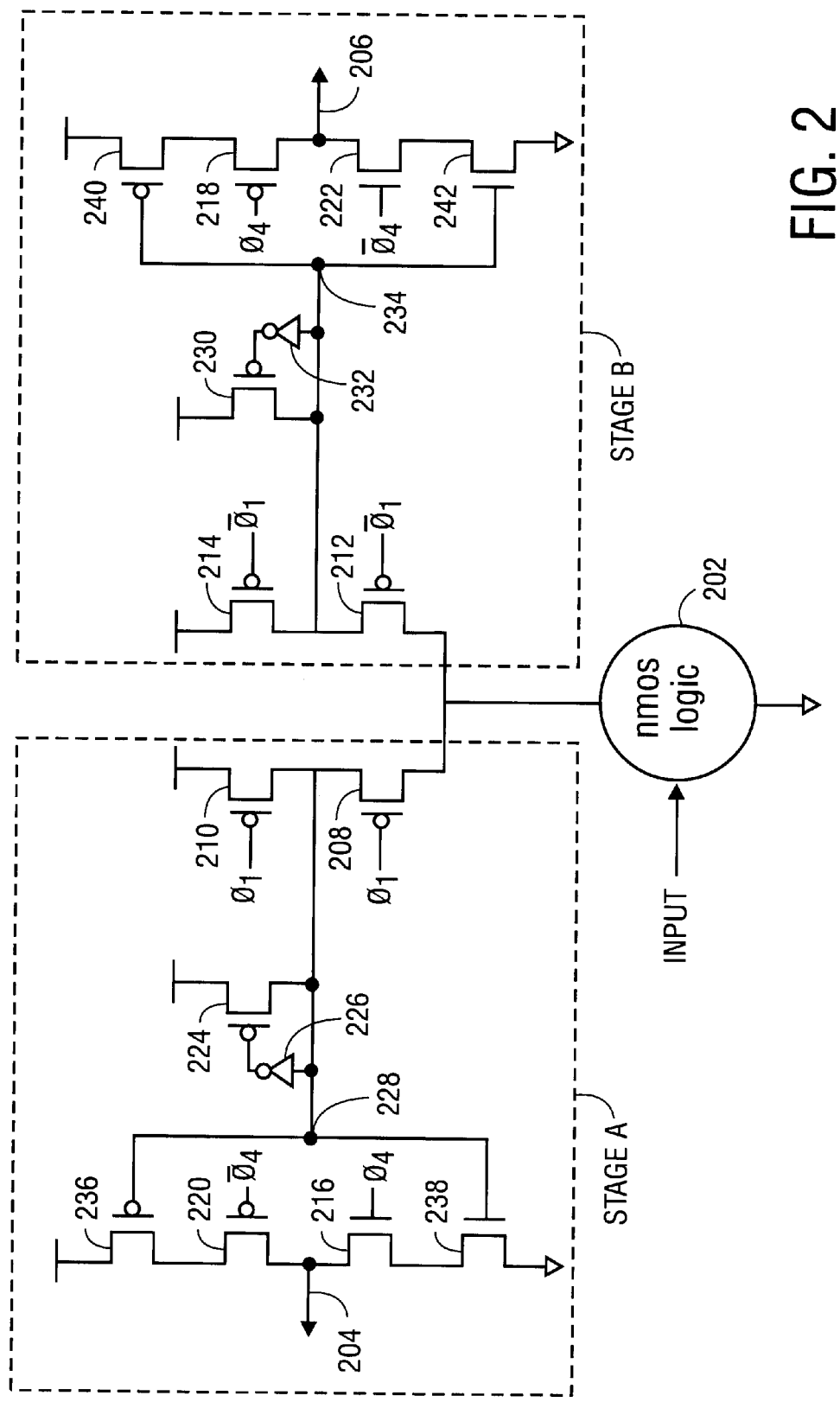
FIG. 2 is a single-ended dynamic logic gate according to an embodiment of the present invention.

An embodiment is shown in FIG. 2, where nMOSFET logic unit 202 comprises a set of nMOSFETs configured in various parallel or serially connected combinations to achieve the overall desired Boolean function. As in FIG. 1, clock signal $\phi_1$ leads clock signal $\phi_4$ by $3\pi/2$. A bar over a signal indicates its Boolean complement. For example, the clock signals $\phi_i$ and $\overline{\phi}_i$ are $\pi$ radians out of phase with respect to each other. The circuit of FIG. 2 represents one stage of a dynamic logic circuit. For simplicity, only one input port to nMOSFET logic unit 202 is indicated, but in practice there usually is more than one input port.

The output signals are provided at output ports 204 and 206. An output signal is provided at output port 204 when clock signal $\phi_4$ is HIGH, and an output signal is provided at output port 206 when clock signal $\overline{\phi}_4$ is HIGH ($\phi_4$ is LOW). Transistors 236, 220, 216, and 238 may be considered forming a first dynamic latch, where the dynamic latch is switched (or clocked) by the clock signal $\phi_4$. Similarly, transistors 240, 218, 222, and 242 may be considered forming a second dynamic latch, where the second dynamic latch is switched (or clocked) by the clock signal $\phi_4$ such that it is switched in complementary fashion with respect to the first dynamic latch.

Although the circuit of FIG. 2 comprises one stage, it is pedagogically convenient to decompose the single stage into sub-blocks or sub-stages, denoted as stage A and stage B in FIG. 2. Clock signal $\phi_1$ clocks (or switches) nMOSFET 208 and pMOSFET 210 in stage A, and its Boolean complement, $\overline{\phi}_1$, clocks nMOSFET 212 and pMOSFET 214 in stage B. Clock signal $\phi_4$ clocks nMOSFET 216 in stage A and pMOSFET 218 in stage B, and its complement, $\overline{\phi}_4$, clocks pMOSFET 220 in stage A and nMOSFET 222 in stage B. When the clock signal $\phi_1$ is HIGH, stage A is in its evaluation phase and stage B is in its pre-charge phase. When the clock signal $\phi_1$ is LOW, stage A is in its pre-charge phase and stage B is in its evaluation phase.

With stage A in its pre-charge phase, pMOSFET 210 pulls node 228 HIGH, and pMOSFET 224 and inverter 226 comprise a keeper so that node 228 is weakly held HIGH. With stage B in its pre-charge phase, pMOSFET 214 pulls node 234 HIGH, and pMOSFET 230 and inverter 232 comprise a keeper so that node 234 is weakly held HIGH. When stage A goes into its evaluation phase, nMOSFET logic unit 202 may pull node 228 LOW depending upon its input when the clock signal $\phi_1$, is HIGH, and when stage B goes into its evaluation phase, nMOSFET logic unit 202 may pull node 234 LOW depending upon its input when the clock signal $\phi_1$ is LOW. The Boolean complement of the signal at node 228 is provided to output node 204 when the clock signal $\phi_4$ is HIGH, and the Boolean complement of the signal at node 234 is provided to output node 206 when the clock signal $\phi_4$ is LOW. In this way, outputs are provided at output ports 204 and 206 on alternate clock phases ($\pi$ radians out-of-phase), so that the throughput of the dynamic stage in FIG. 2 is twice that of prior art dynamic logic.

The dynamic logic stage illustrated in FIG. 2 may be connected to other dynamic logic stages to form a pipeline. In one such embodiment, the output ports 204 and 206 are connected to each other, and to the input port of the next stage in the dynamic pipeline. If the stage in FIG. 2 is considered the zeroth stage in a dynamic pipeline, then the next stage, stage 1, in an embodiment dynamic pipeline is structurally equivalent to the zeroth stage, except that the clock signal $\phi_2$ replaces the clock signal A, and the clock signal $\phi_1$ replaces the clock signal $\phi_4$. Stage 3 in the embodiment is structurally equivalent to stage 2, except that the clock signal $\phi_3$ replaces the clock signal $\phi_2$, and the clock signal $\phi_2$ replaces the clock signal $\phi_1$. This pattern repeats, where for stage i=0, 1, 2, 3, . . . , the clock signals clocking the nMOSFETs coupled to the nMOSFET logic unit in stage i are $\phi_k$ and $\overline{\phi}_k$ where k=i mod(4)+1, and the clock signals clocking the dynamic latches in stage i are $\phi_m$ and $\overline{\phi}_m$ where m=(i+3)mod(4)+1. In this way, the clock signals for the dynamic latches of stage i and the clock signals for the nMOSFET logic unit of stage i+1 differ in phase by ±π/2 so that race conditions are mitigated, and the pre-charge phase of one stage does not interfere with the evaluation phase of the next stage.

Figure 3:
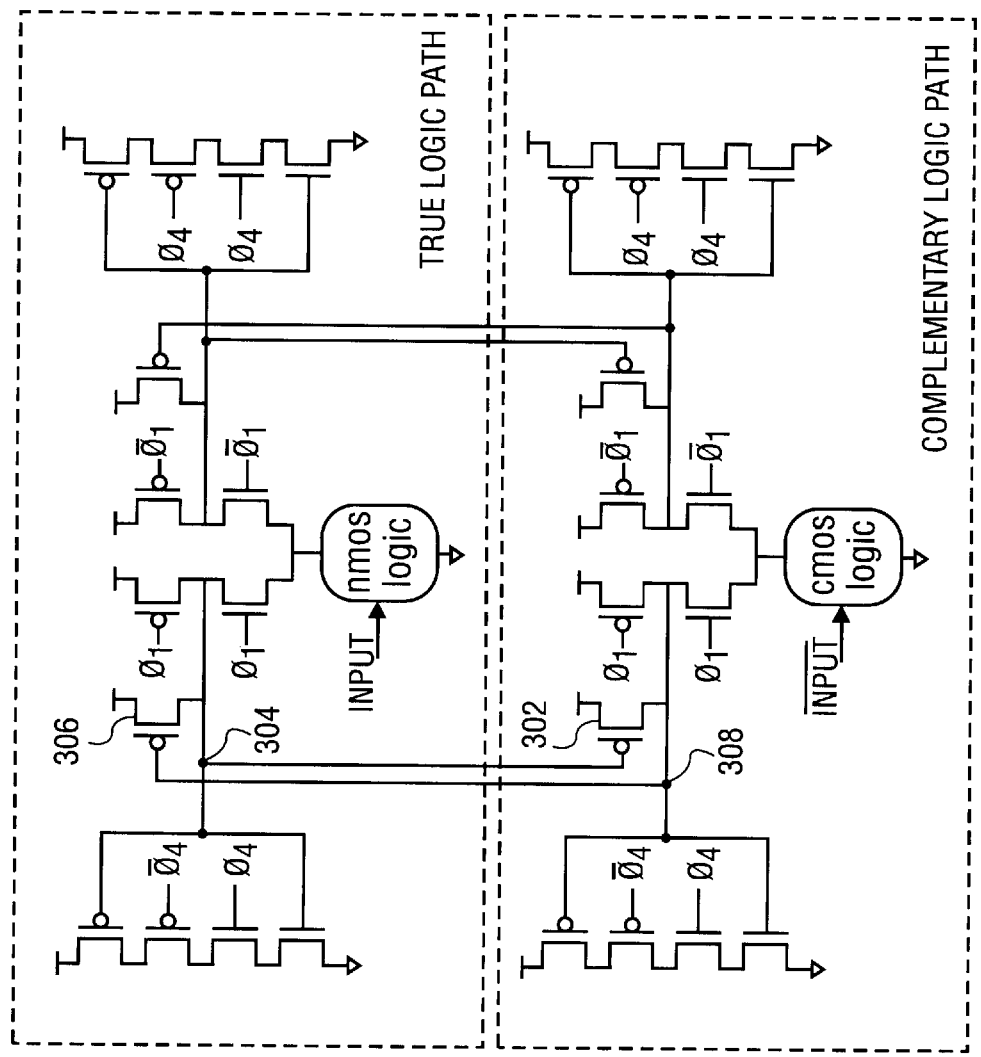
FIG. 3 is a dual-rail dynamic logic gate according to an embodiment of the present invention.

The circuit of FIG. 2 is a single-ended dynamic logic gate. An embodiment of a dual-rail dynamic logic gate is provided in FIG. 3. As illustrated in FIG. 3, the logic gate comprises a complementary logic path and a true logic path. The operation of each path in FIG. 3 is similar to that of the single-ended gate of FIG. 2, except that the keepers are realized by cross-coupling pMOSFETs. For example, pMOSFET 302 in the complementary logic path has its gate connected to node 304 in the true logic path, and the gate of pMOSFET 306 in the true logic path has its gate connected to node 308 in the complementary logic path. In this way, static inverters are not needed for the keepers, and there is no contention between the keepers and the nMOSFET logic units as in the single-ended gates. Consequently, the pMOSFET keepers in FIG. 3 may be sized larger than the pMOSFETs keepers in FIG. 2 so as to help increase noise robustness.

Figure 4:
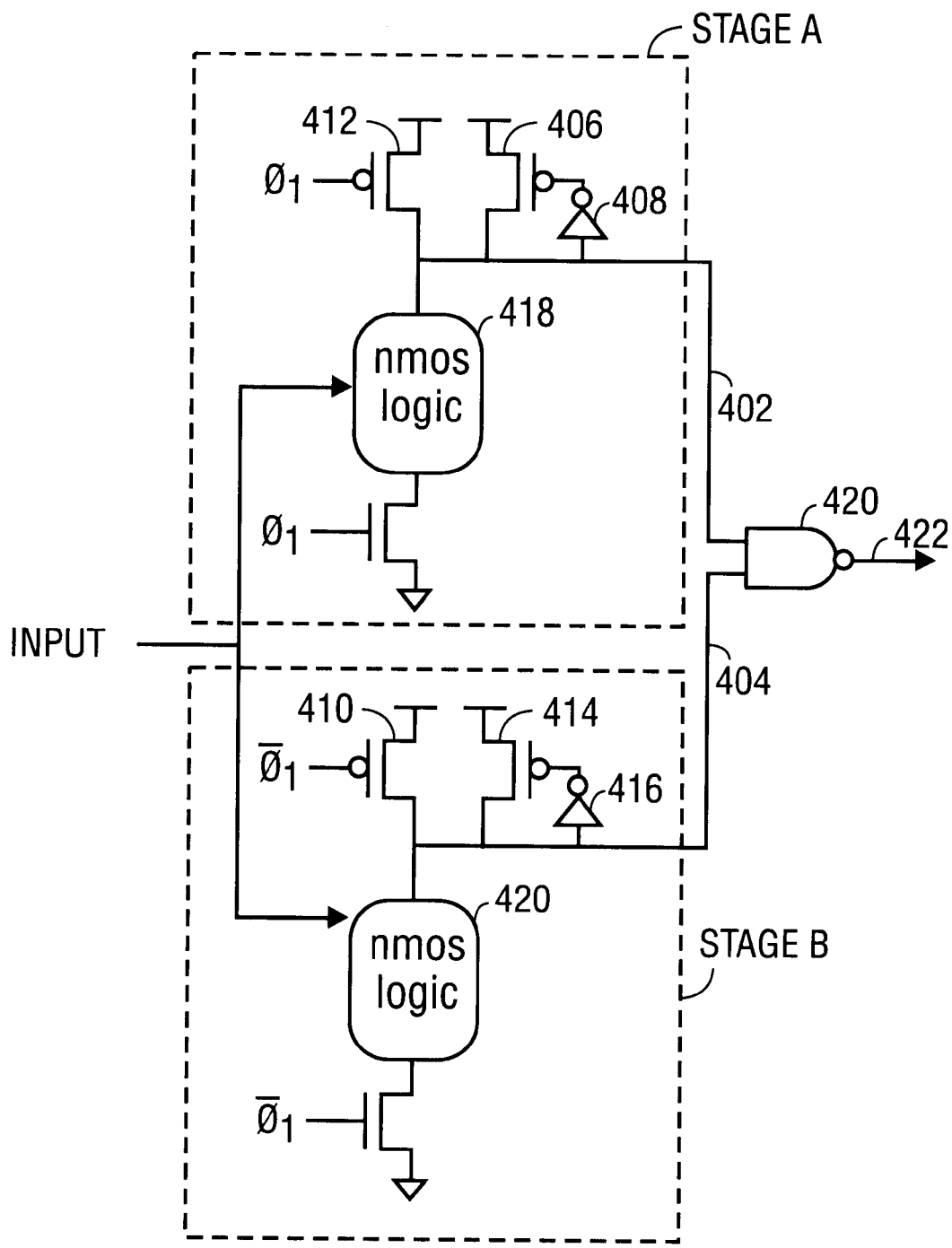
FIG. 4 is a single-ended dynamic logic according to an embodiment of the present invention.

Another embodiment of a single-ended dynamic gate is provided in FIG. 4. The single stage shown in FIG. 4 may be decomposed into stage A and stage B, as was done for the embodiment of FIG. 2. However, clock signals $\phi_1$ and $\overline{\phi}_1$ are used to clock the various MOSFETs in FIG. 4. Stages A and B have their pre-charge and evaluation phases on alternate clock cycles, that is, the pre-charge and evaluation phases are π radians out-of-phase. When the clock signal $\phi_1$ goes HIGH, stage A enters its evaluation phase and stage B enters its pre-charge phase, and when $\phi_1$ goes LOW, stage A enters its pre-charge phase and stage B enters its evaluation phase.

With stage A in its pre-charge phase, pMOSFET 412 pulls output port 402 HIGH, and pMOSFET 406 and inverter 408 comprise a keeper so that output port 402 is weakly held HIGH. With stage B in its pre-charge phase, pMOSFET 410 pulls output port 404 HIGH, and pMOSFET 414 and inverter 416 comprise a keeper so that output port 404 is weakly held HIGH. When stage A goes into its evaluation phase, nMOSFET logic unit 418 may pull output port 402 LOW depending upon its input when the clock signal $\phi_1$ is HIGH, and when stage B goes into its evaluation phase, nMOSFET logic unit 420 may pull output port 404 LOW depending upon its input when the clock signal $\phi_1$ is LOW. In this way, outputs are provided at output ports 402 and 404 on alternate clock phases (π radians out-of-phase).

In the particular embodiment of FIG. 4, output ports 402 and 404 are connected to the input ports of static NAND gate 420 to provide an output signal at output port 422. Because output port 402 is HIGH when stage A is in its pre-charge phase, and output port 404 is HIGH when stage B is in its pre-charge phase, NAND gate 420 provides an output signal at output port 422 every alternate phase of the clock signal. In this way, the throughput for the dynamic logic gate of FIG. 4 may be twice that of the dynamic logic gates of FIG. 1 for the same clock frequency. In another embodiment, output ports 402 and 404 may be provided to other types of embedded static logic.

The dynamic logic gate of FIG. 4 may be pipelined with other dynamic logic gates having an equivalent structure. If the dynamic logic gate of FIG. 4 is considered the zeroth stage in a pipeline, then stage 1 in an embodiment is equivalent in structure except that the clock signal $\phi_1$ is replaced with the clock signal $\phi_2$. Likewise, stage i is clocked by clock signal $\phi_k$ where k=1+imod(4).

Figure 5:
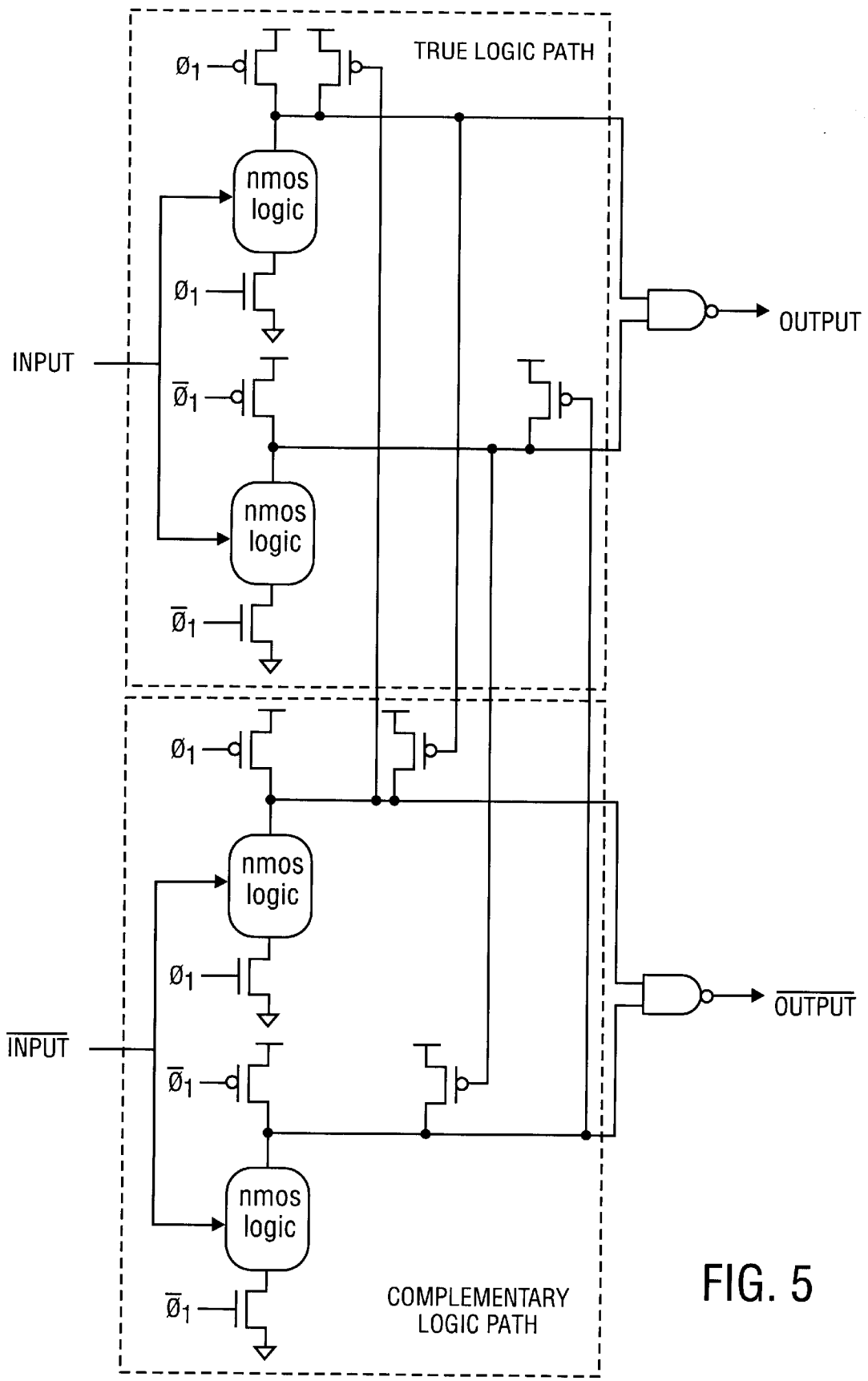
FIG. 5 is a dual-rail dynamic logic gate according to an embodiment of the present invention.

Another embodiment of a dual-rail dynamic logic gate is shown in FIG. 5. As illustrated in FIG. 5, the logic gate comprises a complementary logic path and a true logic path. The operation of each path in FIG. 5 is similar to that of the single-ended gate of FIG. 4, except that the keepers are realized by cross-coupling pMOSFETs, as for the embodiment of FIG. 2.

Various modifications may be made to the disclosed embodiments without departing from the scope of the invention as claimed below. For example, the embodiment of FIG. 2 may be modified so that dynamic logic latches may be used in place of the dynamic latches in FIG. 2 to realize a Boolean function other than the inverse function, or the embodiment of FIG. 4 may be modified so that static logic elements may be used in place of gate 420 to realize a Boolean function other than the NAND function. Similar remarks apply to the other disclosed embodiments.

What is claimed is:

1. A dynamic logic gate having an evaluation phase, the dynamic logic gate comprising:

an nMOSFET logic unit;

a first nMOSFET; and a second nMOSFET;

wherein the first and second nMOSFETs are coupled to the nMOSFET logic unit so that the dynamic logic gate enters its evaluation phase only if the first nMOSFET is switched ON or the second nMOSFET is switched ON, and such that the first and second nMOSFETs are coupled to switch ON and OFF in complementary fashion with respect to each other.

2. The dynamic logic gate as set forth in claim 1, further comprising:

a first node, having a voltage, coupled to the nMOSFET logic unit and the first nMOSFET so that the first node is pulled LOW only if the first nMOSFET is switched ON;

a second node, having a voltage, coupled to the nMOSFET logic unit and the second nMOSFET so that the second node is pulled LOW only if the second nMOSFET is switched ON;

a first dynamic latch connected to the first node to provide a first output signal; and a second dynamic latch connected to the second node to provide a second output signal.

3. The dynamic logic gate as set forth in claim 2, wherein the first nMOSFET is clocked by a first clock signal so that the first nMOSFET is ON if and only if the first clock signal is HIGH; and the first dynamic latch is clocked by a second clock signal to provide the first output signal if and only if the second clock signal is HIGH;

wherein the first and second clock signals have a frequency and the second clock signal lags the first clock signal by (3/2)π radians.

4. The dynamic logic gate as set forth in claim 3, wherein
the second nMOSFET is clocked by the first clock signal so that the second nMOSFET is ON if and only if the first clock signal is LOW; and
the second dynamic latch is clocked by the second clock signal to provide the second output signal if and only if the second clock signal is LOW.

5. The dynamic logic gate as set forth in claim 1, further comprising:
a first node;
a first pMOSFET pullup to pull the first node HIGH only if switched ON and coupled to the first nMOSFET so that the first nMOSFET and the first pMOSFET switch in complementary fashion with respect to each other;
a second node; and
a second pMOSFET pullup to pull the second node HIGH only if switched ON and coupled to the second nMOSFET so that the second nMOSFET and the second pMOSFET switch in complementary fashion with respect to each other.

6. The dynamic logic gate as set forth in claim 5, wherein
the first node has a voltage and is coupled to the nMOSFET logic unit and the first nMOSFET so that the first node is pulled LOW only if the first nMOSFET is switched ON; and
the second node has a voltage and is coupled to the nMOSFET logic unit and the second nMOSFET so that the second node is pulled LOW only if the second nMOSFET is switched ON;
the dynamic logic gate further comprising:
a first dynamic latch connected to the first node to provide a first output signal; and
a second dynamic latch connected to the second node to provide a second output signal.

7. The dynamic logic gate as set forth in claim 6, wherein
the first nMOSFET is clocked by a first clock signal so that the first nMOSFET is ON if and only if the first clock signal is HIGH;
the first dynamic latch is clocked by a second clock signal to provide the first output signal if and only if the second clock signal is HIGH;
the second nMOSFET is clocked by the first clock signal so that the second nMOSFET is ON if and only if the first clock signal is LOW; and
the second dynamic latch is clocked by the second clock signal to provide the second output signal if and only if the second clock signal is LOW;
wherein the first and second clock signals have a frequency and the second clock signal lags the first clock signal by $(3/2)\pi$ radians.

8. A circuit comprising:
a first stage, the first stage comprising:
a nMOSFET logic unit;
a first node;
a first nMOSFET switched according to a clock signal $\phi_1$ so that the first node is pulled LOW only if $\phi_1$ is HIGH;
a second node;
a second nMOSFET switched according to $\bar{\phi}_1$, the Boolean complement of the clock signal $\phi_1$, so that the second node is pulled LOW only if $\bar{\phi}_1$ is HIGH;
a first dynamic latch, having an input port connected to the first node and having an output port, and switched according to a clock signal $\phi_4$ and its Boolean complement $\bar{\phi}_4$ to provide an output signal at its output port only if the clock signal $\phi_4$ is HIGH; and
a second dynamic latch, having an input port connected to the second node and having an output port, and switched according to the clock signals $\phi_4$ and $\bar{\phi}_4$ to provide an output signal at its output port only if the clock signal $\bar{\phi}_4$ is HIGH.

9. The circuit as set forth in claim 8, wherein
the clock signals $\phi_1$ and $\phi_4$ have a clock frequency and $\phi_4$ lags $\phi_1$ by $(3/2)\pi$ radians.

10. The circuit as set forth in claim 9, further comprising:
a second stage, the second stage comprising:
a nMOSFET logic unit having an input port;
a first node;
a first nMOSFET switched according to a clock signal $\phi_2$ so that the first node is pulled LOW only if $\phi_2$ is HIGH;
a second node;
a second nMOSFET switched according to $\bar{\phi}_2$, the Boolean complement of the clock signal $\bar{\phi}_2$, so that the second node is pulled LOW only if $\bar{\phi}_2$ is HIGH;
a first dynamic latch, having an input port connected to the first node and having an output port, and switched according to the clock signals $\phi_1$ and $\bar{\phi}_1$ to provide an output signal at its output port only if the clock signal $\phi_1$ is HIGH; and
a second dynamic latch, having an input port connected to the second node and having an output port, and switched according to the clock signals $\phi_1$ and $\bar{\phi}_1$ to provide an output signal at its output port only if the clock signal $\bar{\phi}_1$ is HIGH;
wherein the output ports of the first stage are connected to the input port of the nMOSFET logic unit of the second stage; and
wherein the clock signal $\phi_2$ has the clock frequency and lags $\phi_1$ by $\pi/2$ radians.

11. A dynamic logic gate having an evaluation phase, the dynamic logic gate comprising:
a logic unit;
a first transistor switched according to a first clock signal;
a second transistor switched ON and OFF in complementary fashion with respect to the first transistor; and
wherein the first and second transistors are coupled to the logic unit so that the dynamic logic gate enters its evaluation phase only if the first transistor is switched ON or the second transistor is switched ON.

12. The dynamic logic gate as set forth in claim 11, further comprising:
a first dynamic latch to provide a first output signal; and
a second dynamic latch to provide a second output signal, wherein the first and second dynamic latches are switched ON and OFF in complementary fashion with respect to each other, and wherein the first dynamic latch and the first transistor are switched ON and OFF at a frequency such that switching of the first dynamic latch lags switching of the first transistor by $(3/2)\pi$ radians.

13. A dynamic logic gate having an evaluation phase, the dynamic logic gate comprising:
a first logic unit;
a second logic unit;
a first transistor coupled to the first logic unit so that the dynamic logic gate enters its evaluation phase only if the first transistor is switched ON; and a second transistor coupled to the second logic unit so that the dynamic logic gate enters its evaluation phase only if the second transistor is switched ON;

wherein the first and second transistors are switched ON and OFF in complementary fashion with respect to each other.

14. The dynamic logic gate as set forth in claim 13, further comprising:

a static logic gate having a first input port coupled to the first logic unit and a second input port coupled to the second logic unit.

15. A dynamic logic gate comprising:

a first node;

a first nMOSFET logic unit;

a first nMOSFET coupled to the first nMOSFET logic unit and the first node to pull the first node LOW only if the first nMOSFET is switched ON;

a second node;

a second nMOSFET logic unit; and a second nMOSFET coupled to the second nMOSFET logic unit and the second node to pull the second node LOW only if the second nMOSFET is switched ON;

wherein the first and second transistors are coupled to switch ON and OFF in complementary fashion with respect to each other.

16. The dynamic logic gate as set forth in claim 15, the dynamic logic gate having an evaluation phase and providing an output voltage during the evaluation phase, the dynamic logic gate further comprising:

a static logic gate having a first input port connected to the first node, a second input port connected to the second node, and an output port to provide the output voltage.

* * * * *

UNITED STATES PATENT AND TRADEMARK OFFICE
CERTIFICATE OF CORRECTION

PATENT NO.   : 6,441,648 B1
DATED        : August 27, 2002
INVENTOR(S)  : Hsu et al.

It is certified that error appears in the above-identified patent and that said Letters Patent is hereby corrected as shown below:

Column 1,
Line 50, delete "provide" and insert -- provided --.

Signed and Sealed this

Twenty-fifth Day of February, 2003

JAMES E. ROGAN
*Director of the United States Patent and Trademark Office*